United States Patent
Martinsson et al.

(10) Patent No.: US 11,062,061 B2
(45) Date of Patent: Jul. 13, 2021

(54) SYSTEM AND METHOD FOR DETERMINING THE MATERIAL LOADING CONDITION OF A BUCKET OF A MATERIAL MOVING MACHINE

(71) Applicant: VOLVO CONSTRUCTION EQUIPMENT AB, Eskilstuna (SE)

(72) Inventors: Torbjörn Martinsson, Valla (SE); Martin Magnusson, Örebro (SE)

(73) Assignee: Volvo Construction Equipment AB, Eskilstuna (SE)

( * ) Notice: Subject to any disclaimer, the term of this patent is extended or adjusted under 35 U.S.C. 154(b) by 234 days.

(21) Appl. No.: 15/554,720

(22) PCT Filed: Mar. 30, 2015

(86) PCT No.: PCT/SE2015/050382
§ 371 (c)(1),
(2) Date: Aug. 31, 2017

(87) PCT Pub. No.: WO2016/159839
PCT Pub. Date: Oct. 6, 2016

(65) Prior Publication Data
US 2018/0239849 A1  Aug. 23, 2018

(51) Int. Cl.
*G06F 30/20* (2020.01)
*G06K 9/00* (2006.01)
(Continued)

(52) U.S. Cl.
CPC .............. *G06F 30/20* (2020.01); *E02F 3/34* (2013.01); *E02F 3/40* (2013.01); *E02F 9/2029* (2013.01);
(Continued)

(58) Field of Classification Search
CPC .. E02F 3/34; E02F 3/40; E02F 9/2029; G06F 30/20; G06K 9/00214; G06K 9/00791
See application file for complete search history.

(56) References Cited

U.S. PATENT DOCUMENTS 5,887,914 A * 3/1999 Hagenbuch ............. B60P 1/267
298/23 R
5,996,702 A * 12/1999 Hall ......................... E02F 9/26
172/4.5
(Continued)

FOREIGN PATENT DOCUMENTS

AU  199895225 A1  7/1999
CN  102762344 A  10/2012
(Continued)

OTHER PUBLICATIONS

International search Report (dated Nov. 27, 2015) for corresponding International App. PCT/SE2015/050382.
(Continued)

*Primary Examiner* — Kibrom K Gebresilassie
(74) *Attorney, Agent, or Firm* — Sage Patent Group (57) ABSTRACT

A system is provided for determining the material loading condition of a bucket of a material moving machine. The system includes an arrangement for generating a surface model of the surface of the material loaded into the bucket and comparing the surface model with a predefined preferred surface shape associated with the bucket.

21 Claims, 6 Drawing Sheets

(51) Int. Cl.
*E02F 3/40* (2006.01)
*E02F 9/20* (2006.01)
*E02F 3/34* (2006.01)
*G05D 1/02* (2020.01)

(52) U.S. Cl.
CPC ..... *G06K 9/00214* (2013.01); *G06K 9/00791* (2013.01); *B60R 2300/302* (2013.01); *B60R 2300/60* (2013.01); *B60Y 2200/412* (2013.01); *G05D 1/0251* (2013.01)

(56) References Cited

U.S. PATENT DOCUMENTS

| | | | | |
|---|---|---|---|---|
| 6,363,632 | B1* | 4/2002 | Stentz | E02F 3/437 37/414 |
| 6,374,201 | B1* | 4/2002 | Grizon | G01V 1/306 703/10 |
| 8,833,861 | B2* | 9/2014 | Donnelli | G01P 15/00 298/20 R |
| 9,309,650 | B2* | 4/2016 | Nagato | E02F 3/435 |
| 9,533,418 | B2 | 1/2017 | Wallack et al. | |
| 10,118,553 | B2* | 11/2018 | Matsuo | H04N 13/239 |
| 2003/0120472 | A1* | 6/2003 | Lind | G06F 30/20 703/13 |
| 2004/0158355 | A1* | 8/2004 | Holmqvist | G05D 1/0236 700/245 |
| 2008/0005938 | A1 | 1/2008 | Aebischer et al. | |
| 2008/0193273 | A1 | 8/2008 | Hagenbuch et al. | |
| 2008/0249679 | A1 | 10/2008 | Matsuda et al. | |
| 2009/0062993 | A1 | 3/2009 | Morey et al. | |
| 2010/0245542 | A1 | 9/2010 | Kim et al. | |
| 2012/0114181 | A1 | 5/2012 | Borthwick et al. | |
| 2012/0191143 | A1 | 7/2012 | Nayet et al. | |
| 2012/0191431 | A1 | 7/2012 | Dunbabin et al. | |
| 2014/0039767 | A1 | 2/2014 | Jensen | |
| 2014/0200863 | A1* | 7/2014 | Kamat | G06T 19/00 703/1 |
| 2014/0291038 | A1 | 10/2014 | Hague et al. | |
| 2015/0081176 | A1* | 3/2015 | Paull | E02F 3/436 701/50 |
| 2015/0240453 | A1* | 8/2015 | Jaliwala | E02F 9/264 701/50 |
| 2015/0379457 | A1* | 12/2015 | Jackson | G06Q 10/06311 705/7.17 |
| 2016/0341041 | A1* | 11/2016 | Puura | E21D 9/003 |
| 2017/0121929 | A1* | 5/2017 | Martinez | E02F 9/2025 |
| 2017/0247860 | A1* | 8/2017 | Lehtinen | E02F 9/2029 |
| 2020/0240110 | A1* | 7/2020 | Takahama | H04Q 9/00 |

FOREIGN PATENT DOCUMENTS

| | | |
|---|---|---|
| CN | 102979131 A | 3/2013 |
| JP | 2002277222 A | 9/2002 |
| JP | 2008241300 A | 10/2008 |

OTHER PUBLICATIONS

European Official Action (dated Feb. 20, 2019) for corresponding European App. 15 887 920.5.
C.J. Coetzee et al: "The numerical modelling of excavator bucket filling using OEM", Journal of Terramechanics, val. 46, No. 5, Oct. 1, 2009.
Chinese First Office Action dated Nov. 27, 2020 for Chinese Patent Application No. 201580077071.4, 14 pages.

* cited by examiner

SYSTEM AND METHOD FOR DETERMINING THE MATERIAL LOADING CONDITION OF A BUCKET OF A MATERIAL MOVING MACHINE

BACKGROUND AND SUMMARY

The present disclosure relates to a system for determining the material loading condition of a bucket of a material moving machine. Moreover, the present disclosure relates to a material moving machine as well as a method for determining the material loading condition of a bucket of a material moving machine.

The present disclosure can be utilized in material moving machines, such as wheel loaders, excavators, bulldozers etcetera. Although the invention will be described with respect to a wheel loader, the invention is not restricted to this particular material moving machine, but may also be used in other types of material moving machines.

A material moving machine, such as a wheel loader, generally comprises a bucket that is adapted to be filled with material, such as gravel, during a material moving operation. In order to obtain an appropriate operation, it is generally desired to have an appropriate amount of material filled in the bucket.

In a situation in which the bucket is filled with a small amount of material, there is a risk that the material moving operation may be associated with unnecessarily high time consumption and/or fuel consumption since the material moving machine may have to carry out more work cycles than what would have been needed, had the bucket been appropriately filled. On the other hand, if the bucket is excessively filled with material, there is a risk that material will be spilled during the material moving operation.

An assessment of the loading condition of a bucket may be performed by reading the weight of the material in a filled bucket. However, only the weight of the filled material does not always provide sufficient information for determining whether or not a bucket is appropriately filled.

It is desirable to provide a system for determining the material loading condition of a bucket of a material moving machine, which system provides relevant information as to whether or not the bucket is appropriately filled.

The present disclosure relates to a system for determining the material loading condition of a bucket of a material moving machine. The system comprises means for generating a surface model of the surface of the material loaded into the bucket and comparing the surface model with a predefined preferred surface shape associated with the bucket.

The above system implies an improved manner of determining the material loading condition of a bucket. For instance, by virtue of the surface model thus generated by the system, a more thorough assessment of the bucket material loading condition is enabled.

Purely by way of example, depending on their designs, different types of buckets may be associated with different preferred surface shapes and the generation of a surface model of the loaded material implies useful information for determining whether or not the current bucket is appropriately filled.

Optionally, the system is adapted to generate a three-dimensional model of the surface of the material loaded into the bucket. A three-dimensional model of the surface implies a plurality of possibilities for determining the material loading condition, e.g. in terms of the slopes of the material loaded into the bucket and/or the centre of gravity in all three dimensions of the material loaded into the bucket.

Optionally, the predefined preferred surface shape is dependent on the type of material loaded into the bucket. As such, instead of, or in addition to, determining a predefined preferred surface shape based on the type of bucket, the material loading condition may be determined taking the actual type of material into account.

Optionally, the predefined preferred surface shape comprises information as regards a nominal angle of repose for the material loaded into the bucket.

Optionally, the system is adapted to determine a spillage parameter indicative of the risk of spilling and/or a fill factor parameter indicative of the material fill factor.

Optionally, the system is adapted to issue a signal indicative of the material loading condition, the system preferably being adapted to issue a signal indicative of whether or not the bucket is appropriately loaded.

Optionally, the system comprises a perception assembly for generating the surface model, the perception assembly preferably comprising at least one of a camera and a laser sensor.

Optionally, the perception assembly is adapted to generate the three-dimensional surface model of the surface of the material loaded into the bucket, the perception assembly preferably comprising at least one of a time-of-flight camera, a stereo camera, a structured light camera or an actuated laser range finder.

Optionally, at least a portion of the perception assembly is adapted to be attached to a portion of the material moving machine.

As second aspect of the present disclosure relates to a material moving machine comprising a bucket. The material moving machine further comprises a system for determining the material loading condition of the bucket. The system comprises means for generating a surface model of the surface of the material loaded into the bucket and comparing the surface model with a predefined preferred surface shape associated with the bucket.

Optionally, the material moving machine comprises a cabin with a cabin top, wherein at least the above-recited portion of the perception assembly is attached to the cabin top.

As third aspect of the present disclosure relates to a method for determining the material loading condition of a bucket of a material moving machine. The method comprises generating a surface model of the surface of the material loaded into the bucket, and comparing the surface model with a predefined preferred surface shape associated with the bucket.

Optionally, the predefined preferred surface shape comprises information as regards a nominal angle of repose for the material loaded into the bucket.

Optionally, the bucket comprises a bucket bottom and a bucket opening rim with at least three rim points, wherein the predefined preferred surface shape is generated by forming a set of rim point planes by:

generating a rim point plane for each pair of adjacent rim points, wherein the rim point plane intersects each one of the pair of adjacent rim points and extends towards the opposing side of the bucket with a plane angle indicative of the nominal angle of repose, and assembling the set of rim point planes to form the predefined preferred surface shape, the predefined preferred surface shape comprising a rim point plane floor portion of each rim point plane, a rim point plane floor portion having a location such that no other plane of the set of rim point planes is located between the rim point plane floor portion and the bucket bottom.

Optionally, the bucket opening rim comprises at least three rim corners, the rim points comprising the rim corners.

Optionally, the feature of comparing the surface model with a predefined preferred surface shape associated with the bucket comprises determining the volume of the material exceeding the predefined preferred surface shape.

Optionally, the feature of comparing the surface model with a predefined preferred surface shape associated with the bucket comprises determining the volume of the material that exceeds each rim point plane floor portion.

Optionally, the feature of comparing the surface model with a predefined preferred surface shape associated with the bucket comprises:

determining a plurality of surface model points;

for each one of the surface model points that exceeds the predefined preferred surface shape, determining the smallest distance between the surface model point and the predefined preferred surface shape.

Optionally, the method further comprises determining a parameter indicative of the average value and/or standard deviation of the smallest distance between the surface model point and the predefined preferred surface shape for all of the surface model points that are located outside of the predefined preferred surface shape.

BRIEF DESCRIPTION OF THE DRAWINGS

With reference to the appended drawings, below follows a more detailed description of embodiments of the invention cited as examples.

In the drawings.

DETAILED DESCRIPTION

The invention will be described in the following for a material moving machine in the form of a wheel loader 10 such as the one illustrated in FIG. 1. The wheel loader 10 should be seen as an example of a material moving machine which could comprise a system according to the present invention and/or for which the method of the present invention may be used. However, it is also envisaged that the present invention may be implemented in another type of material moving machine, such as an excavator (not shown) or a bulldozer (not shown). Moreover, it should be emphasized that although the invention is described hereinbelow with reference to a movable material moving machine, the invention is equally applicable on, and consequently also comprises, stationary material moving machines.

Figure 1:
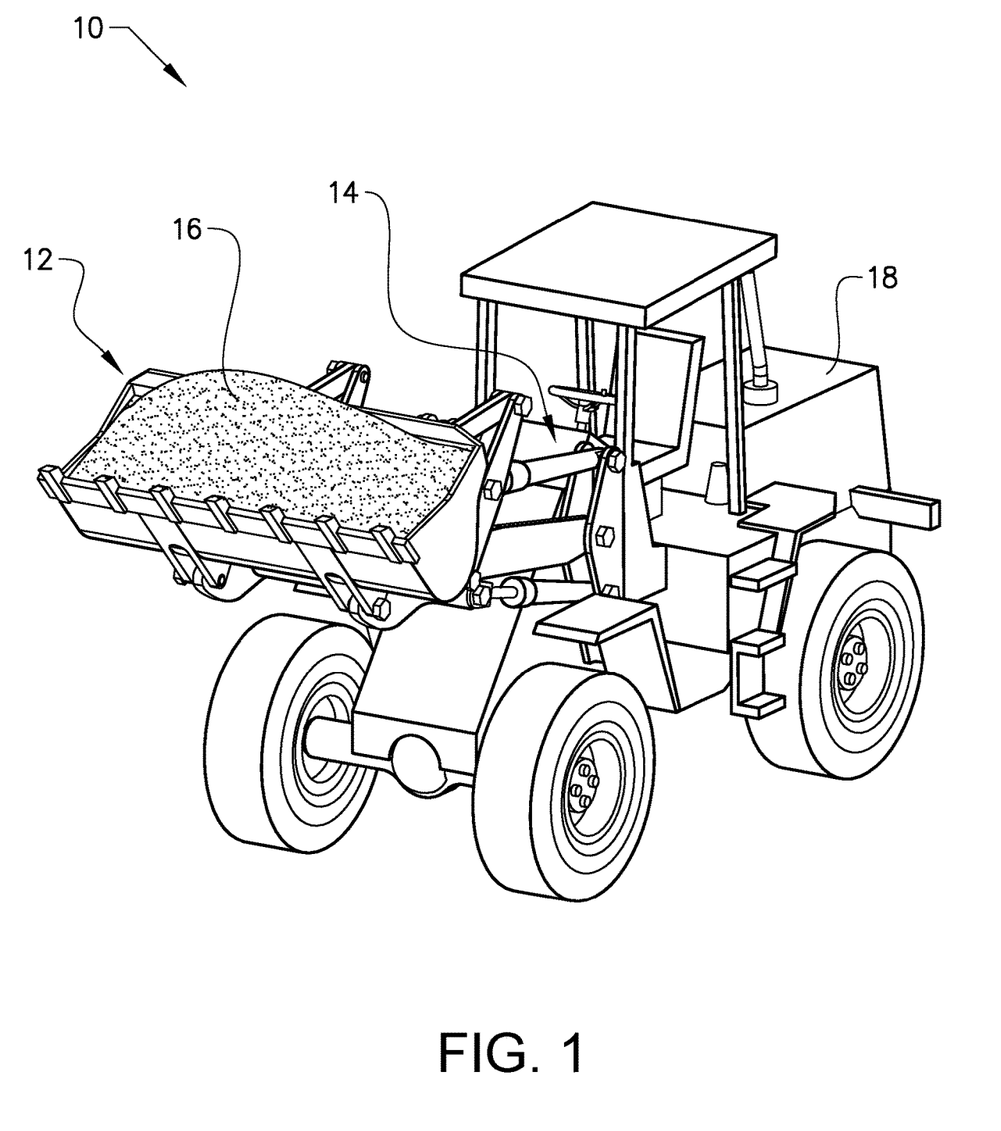
FIG. 1 is a schematic perspective view of a material moving machine.

The FIG. 1 material moving machine 10 comprises a bucket 12. Moreover, the material moving machine 10 comprises an actuating arrangement 14 for lifting and/or tilting the bucket 12. Purely by way of example, the actuating arrangement 14 may comprise a hydraulic actuator and/or an electric actuator (not shown in FIG. 1).

Purely by way of example, the bucket 12 may be adapted to be moved, relative to the ground and/or relative to the remaining portion of the material moving machine, to thereby be loaded with material.

Moreover, FIG. 1 illustrates that the bucket 12 is filled with material 16. Purely by way of example, the material may comprise sand, gravel, soil, pebbles, rocks or the like.

FIG. 1 further illustrates a system 18 for determining the material loading condition of the bucket 12 of the material moving machine 10. In FIG. 1, the material moving machine 10 comprises the system 18. However, it is also envisaged that the system 18 may be spatially separated from the material moving machine 10. Purely by way of example, the system 18, or at least parts of it, may be located in a stationary or moving object spatially separated from the material moving machine 10.

The system 18 comprises means for generating a surface model of the surface of the material loaded into the bucket.

Figure 2:
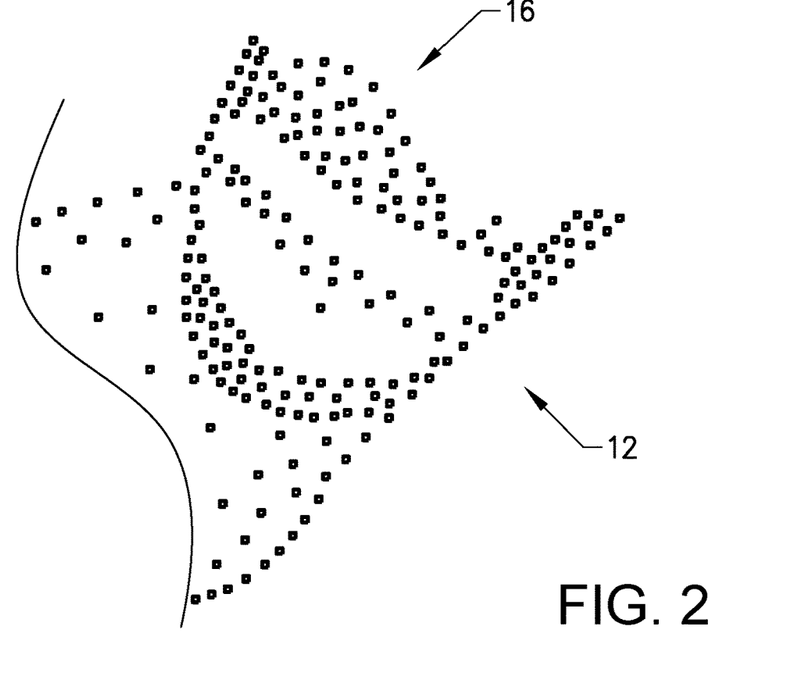
FIG. 2 is a schematic side view of an image of a bucket filled with material.

To this end, though purely by way of example, FIG. 2 illustrates an image of the FIG. 1 bucket 12 and material 16, which image has been generated by the system 18. Purely by way of example, the FIG. 2 model may be generated by a point cloud measurement of the bucket 12 and the material 16.

Figure 3:
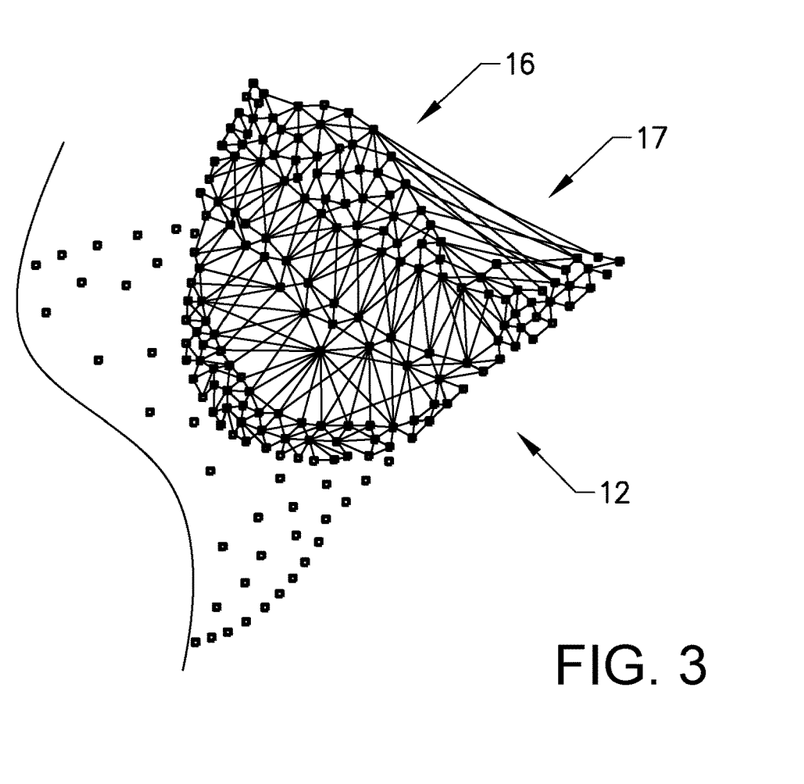
FIG. 3 is a schematic side view of a surface model of a material surface.

Furthermore, FIG. 3 illustrates a surface model 17 of the surface of the material 16. The FIG. 3 surface model 17 has been generated on the basis of the FIG. 2 image. Purely by way of example, the FIG. 3 surface model 17 may be generated by extrapolating the data, e.g. points, obtainable from the FIG. 2 image.

It should be noted that in FIG. 2 and FIG. 3, the image and the surface model 17 are three-dimensional models, which are preferred implementations of the image and surface model. However, it is also envisaged that embodiments of the system 18 instead generate a two-dimensional image and/or surface model. Furthermore, although FIG. 2 and FIG. 3 illustrate an alternative in which the surface model is generated in two steps, viz firstly generating an image and thereafter generating a surface model 17, it is envisaged that the surface model may be generated in a single step, e.g. by generating the surface model on the basis of a set of points of at least the material surface, or by using more steps than two.

The system 18 may be adapted to identify the type of bucket 12 in the FIG. 3 image. Purely by way of example, the system may be adapted to read a bucket identifier (not shown) such as a bar code or any other type of identification information. It should be noted that the identification information need not necessarily contain visually readable information but may instead contain information that may be read using e.g. a radio wave sensor, a magnetic sensor or the like. Instead of, or in addition to, reading a bucket identifier, the system 18 may be adapted to generate a model of the bucket 12, e.g. based on the image of the bucket 12 and material 16, and compare the model of the bucket with a stored set of models. As a further option, the type of bucket 12 may be manually inputted into the system 18, e.g. by an operator of the material moving machine 10.

Irrespective of how the type of bucket 12 is identified, the system may be adapted to remove portions, e.g. points, of the model of the material 16 loaded into the bucket 12 such that only the portion of the material 16 that is located inside a bounding box of a bucket model may be regarded when assessing the loading condition.

Once the relevant portions of the material have been identified, the system 18 may generate a surface model 17, for instance by generating a mesh of triangular elements wherein a node in a triangular element corresponds to a point the image of the material. The mesh thus generated may constitute the surface model 17. Once the surface model 17, and its position and orientation in relation to the bucket, have been identified, entities such as the volume of the material 16 loaded into the bucket 12 may be determined.

Such a volume determination may be performed in a plurality of ways. As a non-limiting example, a geometrical model of the bucket 12 may be combined with the surface model 17 and the volume enclosed by the above two models may be determined by integration.

FIG. 3 illustrates an example of such an integration in which the interior of the bucket 12 has been modelled by a plurality of bucket nodes. The bucket nodes and the nodes of the surface model 17 are combined triangulate elements that are generated between adjacent nodes. For each triangular element, a tetrahedron element may be generated, three corners of which are the nodes of the triangular element and the fourth corner is the centroid of the volume enclosed by the bucket nodes and the nodes of the surface model 17. Purely by way of example, the location of such a centroid may be calculated by calculating the mean value of the location the bucket nodes and the nodes of the surface model 17.

Furthermore, the system 18 may be adapted to determine a predefined preferred surface shape associated with the bucket 12, viz the bucket type thus determined. Purely by way of example, the system 18 may be adapted to determine the predefined preferred surface shape by receiving data from a database. The database may form part of the system 18. Alternatively, the database may be separate of the system 18 and the system 18 may comprise means for communicating with the database.

Irrespective of how the predefined preferred surface shape is determined, the system 18 is adapted to compare the surface model with a predefined preferred surface shape associated with the bucket 12.

The predefined preferred surface shape need not exclusively be based on the relevant bucket 12. It is envisaged that the predefined preferred surface shape may also be dependent on the type of material loaded into the bucket 12.

The preferred surface shape of the material loaded into a bucket may vary with the type of material that is loaded into the bucket 12. To this end, the system 18 is preferably adapted to receive information indicative of the type of material that is to be loaded or has been loaded into the bucket. Purely by way of example, the system 18 may be adapted to receive input from an operator indicative of the type of material. As another option, the system 18 may be able to determine the type of material by e.g. reading the weight of the material loaded into the bucket, for instance using one or more weight sensors (not shown), determining the volume of the material loaded into the bucket, e.g. using the above-discussed image and/or the above-discussed surface model, determining the density of the material and from the density thus determined establish the type of material.

As a further option, the system 18 may be able to determine the type of material by determining the location of the bucket, e.g. using a GPS system or the like, and using data of the material at that location, e.g. using a database, a look-up table, and thus determine the type of material.

Regardless of how the type of material is determined, the system 18 is preferably adapted to determine a predefined preferred surface shape associated with the bucket 12, viz the bucket type thus determined, and also the type of material thus determined. Purely by way of example, the predefined preferred surface shape, based on the above two parameters of bucket type and material type, may be determined by receiving data from a database. Instead of, or in addition to, receiving data from a database, the system 18 may be adapted to calculate the predefined preferred surface shape based on the bucket and material types.

A parameter that may be relevant when determining a predefined preferred surface shape for a material type is the nominal angle of repose, viz the steepest angle relative to a horizontal plane to which a material can be piled without slumping, for the material loaded into the bucket 12. Based on the nominal angle of repose for the type of material and the type of bucket 12, it is possible to determine a predefined preferred surface shape. Purely by way of example, such a predefined preferred surface shape comprises a volume with an inclined top surface, such as a pile, wherein shape of the volume is such that an appropriately large volume of material may be loaded into the bucket 12 but wherein the inclination of the volume's top surface is equal to or below the above-discussed nominal angle of repose for that material type.

Based on the surface model thus generated and the predefined preferred surface shape thus determined, the system 18 may be adapted to determine a spillage parameter indicative of the risk of spilling and/or a fill factor parameter indicative of the material fill factor.

Purely by way of example, the system 18 may be adapted to issue a signal indicative of the material loading condition. For instance, the system 18 may be adapted to issue a signal indicative of whether or not the bucket 12 is appropriately loaded.

As a non-limiting example, the signal indicative of whether or not the bucket 12 is appropriately loaded may comprise information as regards the volume of the material in the bucket that exceeds the predefined preferred surface shape. As a further non-limiting example, the signal may comprise information as regards the location of the volume exceeding the predefined preferred surface shape.

Figure 4:
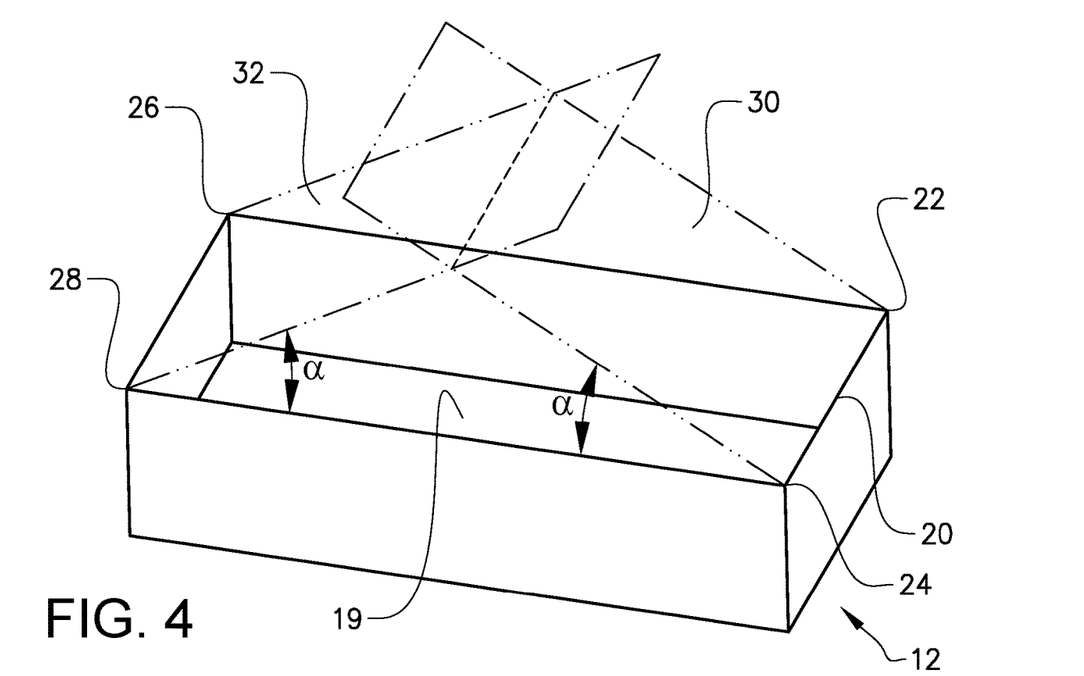
FIG. 4-FIG. 6 illustrate an example of a predefined preferred surface shape.
Figure 5:
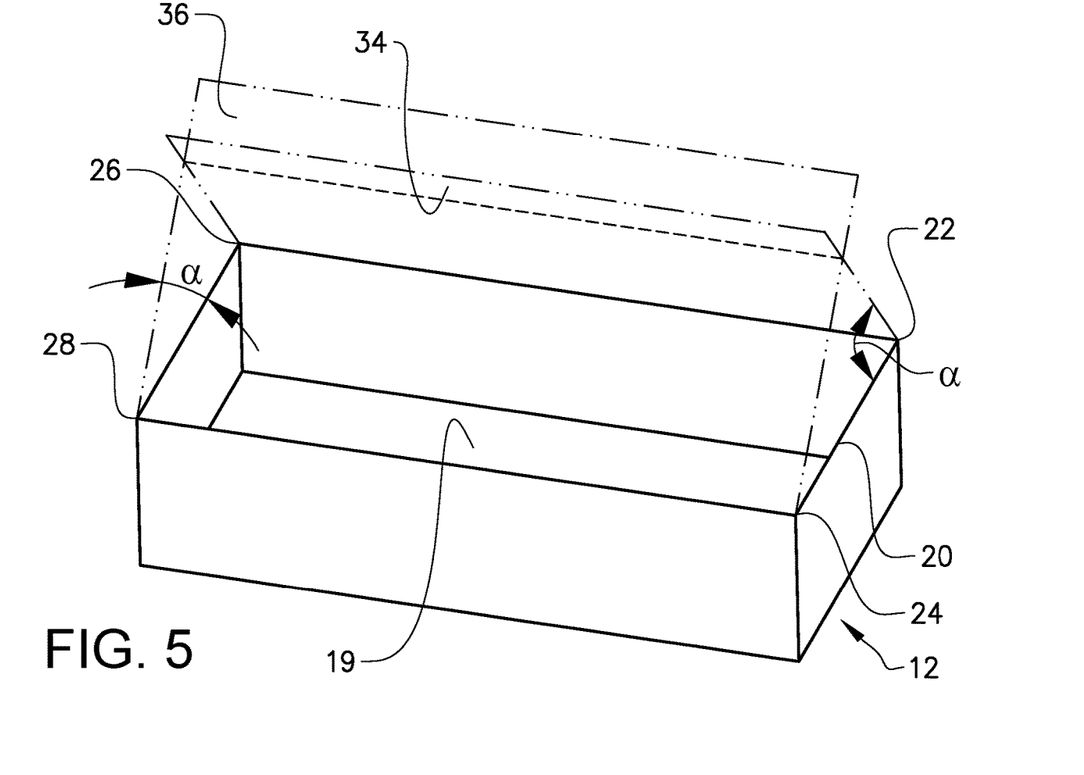
Figure 6:
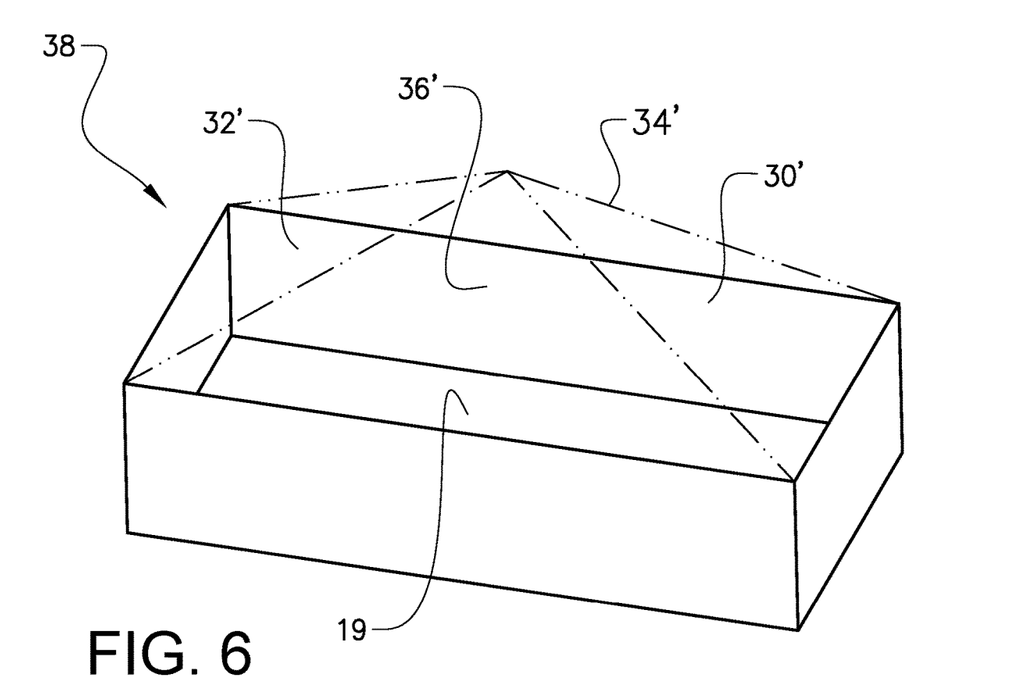

FIGS. 4 to 6 illustrate how a predefined preferred surface shape may be generated for a bucket 12 and a nominal angle of repose for a material.

The implementation of the bucket 12 illustrated in FIG. 4 comprises a bucket bottom 19 and a bucket opening rim 20. The bucket opening rim 20 comprises at least three rim points. The bucket implementation illustrated in FIG. 4 comprises four rim corners 22, 24, 26, 28 that also constitute the rim points. However, it is also envisaged that at least one rim point may be located in another rim position than in a rim corner.

Based on the rim points 22, 24, 26, 28, a set of rim point planes is formed by generating a rim point plane for each pair of adjacent rim points 22, 24, 26, 28, wherein the rim point plane intersects each one of the pair of adjacent rim points and extends towards the opposing side of the bucket 12 with a plane angle $\alpha$ indicative of the nominal angle of repose.

FIG. 4 illustrates two rim point planes 30, 32 and FIG. 5 illustrates two further rim point planes 34, 36.

With reference to FIG. 4, a first rim point plane 30 is generated for adjacent rim points, viz a first rim point 22 and a second rim point 24. The first rim point plane intersects each one of the pair of adjacent rim points 22, 24 and extends towards the opposing side of the bucket 12 with a plane angle α indicative of the nominal angle of repose. Purely by way of example, the plane angle α may be a function, e.g. proportional to, the nominal angle of repose. As a non-limiting example, the plane angle α may be the same, or at least substantially the same, as the nominal angle of repose.

A second rim point plane 32 is generated for another set of adjacent rim points, viz a third rim point 26 and a fourth rim point 28 in FIG. 4.

FIG. 5 illustrates a third rim plane 34 and a fourth rim plane 36 for the two other sets of adjacent rim points, viz the first 22 and third 26 rim point as well as the second 24 and the fourth 28 rim point.

FIG. 6 illustrates that the predefined preferred surface shape 38 may be generated by assembling the set of rim point planes. FIG. 6 illustrates that the predefined preferred surface shape 38 comprises a rim point plane floor portion 30', 32', 34', 36' of each rim point plane. A rim point plane floor portion has a location such that no other plane of the set of rim point planes is located between the rim point plane floor portion and the bucket bottom.

As has been intimated hereinabove, the signal indicative of whether or not the bucket 12 is appropriately loaded may comprise information as regards the volume of the material in the bucket that exceeds the predefined preferred surface shape.

Figure 7:
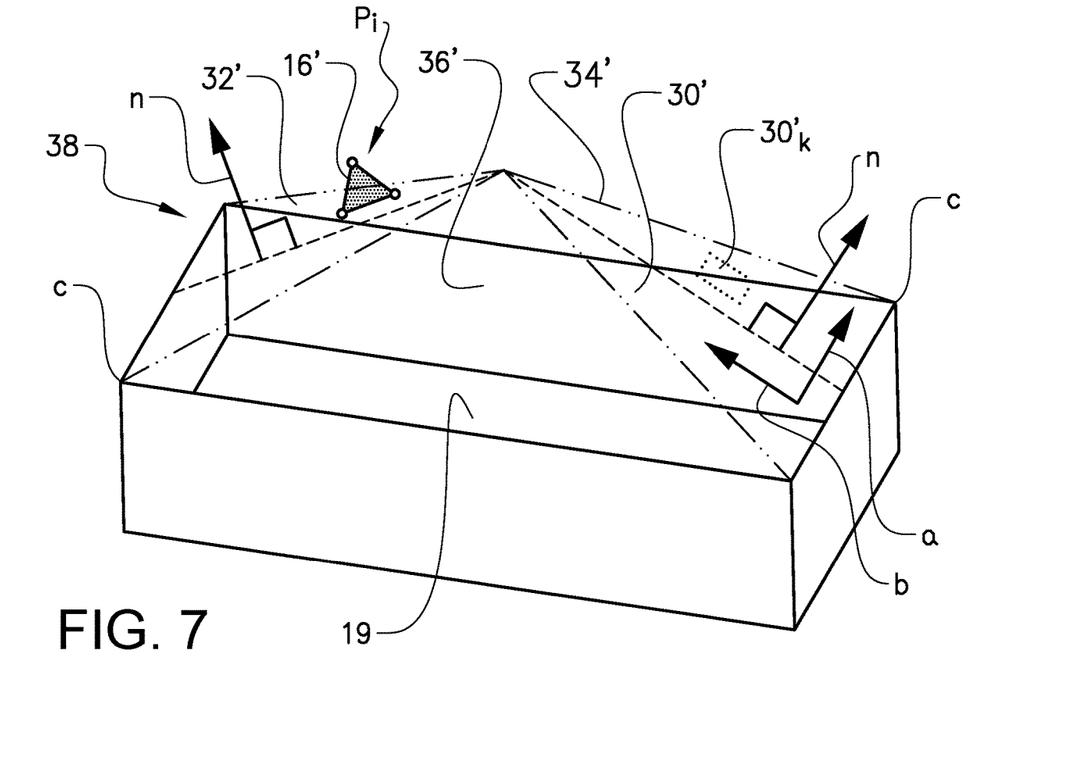
FIG. 7 illustrates an implementation of comparing a surface model with a predefined preferred surface shape.

FIG. 7 illustrates a loading condition in which a portion 16' of the material 16 in the bucket 12 exceeds the predefined preferred surface shape 38. As used herein the expression "exceeds the predefined preferred surface shape" indicates a position on the side of the predefined preferred surface shape 38 which faces away from the bucket bottom 19.

As such, embodiments of the system 18 and/or a method may comprise determining the volume of the material exceeding the predefined preferred surface shape 38. The magnitude of the volume may provide appropriate information as to whether or not the bucket is appropriately filled. Purely by way of example, a loading condition having a large volume that exceeds the predefined preferred surface shape 38 may have a high risk of spilling and may therefore be less preferred.

In the load condition illustrated in FIG. 7, the portion 16' of the material 16 in the bucket 12 is located in the second rim point plane floor portion 32'. In accordance with an embodiment of the system 18 and/or the method, the feature of comparing the surface model 17 with a predefined preferred surface shape associated with the bucket 12 comprises determining the volume of the material that exceeds each rim point plane floor portion 30', 32', 24', 36'.

The feature of comparing the surface model with a predefined preferred surface shape associated with the bucket may comprise determining a plurality of surface model points. Purely by way of example, the surface model points could be related to a point cloud measurement of the bucket 12 and the material 16, such as the point cloud measurement procedure presented hereinabove with reference to FIG. 2. As such, as a non-limiting example, the surface model points could be at least a subset of the points of the point cloud.

However, it is also envisaged that the surface model points are generated on the basis of a surface model of the surface of the material 16 loaded into the bucket 12.

Irrespective of how the surface model points are generated, the feature of comparing the surface model with a predefined preferred surface shape associated with the bucket may further comprise, for each one of the surface model points that exceeds the predefined preferred surface shape, determining the smallest distance d between the surface model point and the predefined preferred surface shape.

Purely by way of example, the smallest distance d may be determined by assuming a plane defined by a point c (for instance chosen to be a rim point and or a rim corner), a normal n, and a surface model point p.

The smallest distance d may then be computed by the following equation:

$$d(p,c,n) = (p-c) \cdot n \quad \text{Equation 1}$$

The variance of a set of points $P = \{p_1, \ldots, p_n\}$ is computed as $$\sigma^2 = \frac{1}{n+1} \sum_{i=1}^{n} d(p_i, c, n)^2.$$

In this case, however, we are only interested in points outside of the model volume; i.e., points with a positive distance d. A more relevant measure, then, is the variance around the mean positive distance m. Let $Q = \{p_1, \ldots, p_k\}$ be the set of points whose distance $d(p,c,n)$ is positive.

It is then possible to determine the average value and/or standard deviation of the smallest distance between the surface model point and the predefined preferred surface shape for all of the surface model points that are located outside of the predefined preferred surface shape.

The average value m of the smallest distance d may be determined in accordance with the following:

$$m = \frac{1}{k} \sum_{i=1}^{k} d(p_i, c, n) \quad \text{Equation 2}$$

and the variance σ2 of the smallest distance d by be determined by:

$$\sigma^2 = \frac{1}{k+1} \sum_{i=1}^{k} (d(p_i, c, n) - m)^2 \quad \text{Equation 3}$$

Instead of, or in addition to, determining the average value and/or variance of the smallest distance d, the smallest distance d for a set of surface model points may be presented in relation to the predefined preferred surface shape. Purely by way of example, the smallest distance d for a set of surface model points may be presented for each rim point plane floor portion 30', 32', 24', 36'.

As such, each rim point plane floor portion comprises a reference point c, a normal n and two plane vectors a, b each one of which extending in the plane of the relevant rim point plane floor portion.

To this end, reference is again made to FIG. 7 in which the above-discussed geometrical entities c, n, a, b are illustrated for the first rim point plane floor portion 30'. However, it should be noted that each one of the first rim point plane floor portions comprises these entities.

The first rim point plane floor portion 30' may be divided into a plurality of portion areas 30'$k$, or portion cells, each one of which having an extension in directions parallel to the a and b vectors. For each one portion cells 30'$k$, the average value m and/or the variance σ2 may be determined in accordance with Equation 2 or Equation 3, respectively. The thus determined average value m and/or the variance σ2 may then be presented for each portion cell 30'k, for instance by colour coding each portion cell 30'k with a colour corresponding to the determined value(s) or by presenting histograms with bars for each portion cell.

In order to determine the surface model, the means for generating a surface model of the system 18 may comprise a perception assembly for generating the surface model. As non-limiting examples, the perception assembly may comprise at least one of a camera and a laser sensor. In the event that the system 18 is adapted to generate a three-dimensional surface model, the perception assembly may comprise at least one of a time-of-flight camera, a stereo camera, a structured light camera or an actuated laser range finder.

Figure 8:
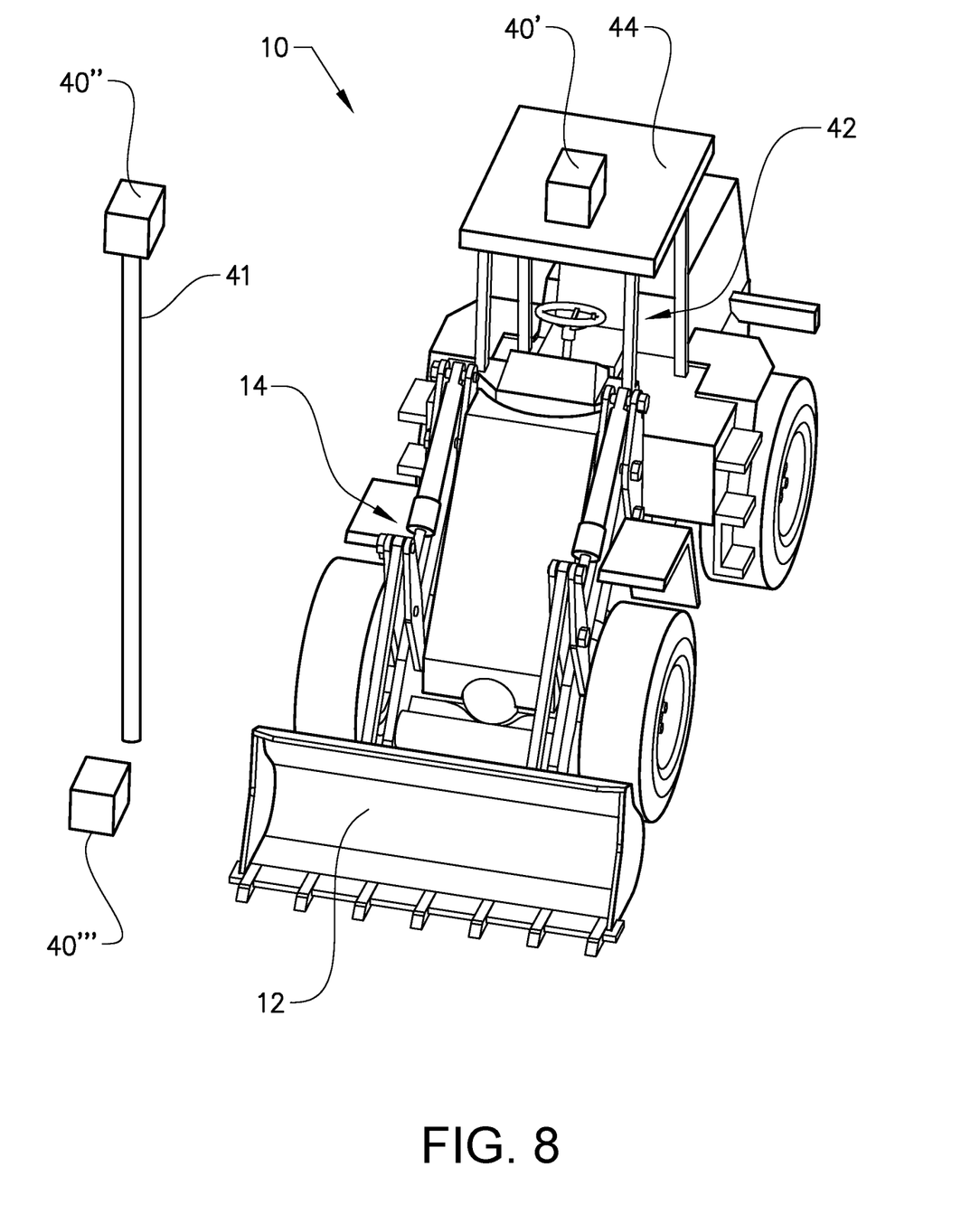
FIG. 8 is a schematic perspective view of a material moving machine comprising alternative implementations of perception assemblies.

FIG. 8 illustrates the FIG. 1 material moving machine 10 and two alternative implementations of the perception assembly 40. In the first alternative implementation, a perception assembly 40' is attached to the material moving machine 10. Purely by way of example, and as is indicated in FIG. 8, the material moving machine 10 may comprise a cabin 42 with a cabin top 44, wherein at least the portion of the perception assembly 40' of the first alternative is attached to the cabin top 44. However, it is also envisaged that the first alternative implementation of the perception assembly 40' may be attached to another portion of the material moving machine 10, such as the actuating arrangement 14.

In the second alternative implementation of the perception assembly, a perception assembly 40" is not attached to the material moving machine 10. Moreover, though purely by way of example, the perception assembly 40" in accordance with the second alternative implementation is spatially separated from the material moving machine 10. As non-limiting examples, the perception assembly 40" in accordance with the second alternative implementation may be located on a stationary object, such as a mast (not shown) or the like, or may be located on a moving object. By way of example only, the moving object may be an object that is capable of flying and that has one or more rotors, e.g. a helicopter or a quadcopter.

Figure 9:
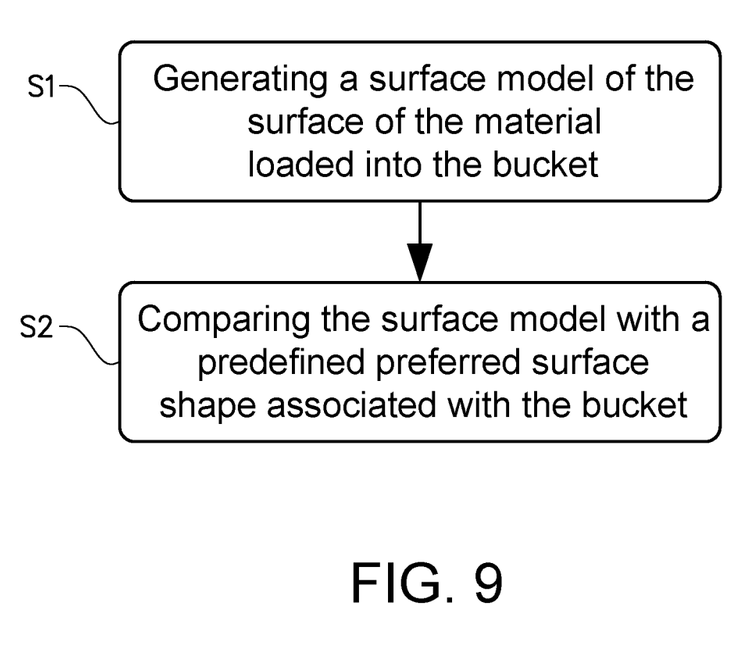
FIG. 9 is a flow chart of a method.

Finally, FIG. 9 illustrates a flow chart illustrating a method in accordance with a third aspect of the present invention. The third aspect relates to a method for determining the material loading condition of a bucket of a material moving machine. The bucket may be adapted to be moved to thereby be loaded with the material.

As may be gleaned from FIG. 9, the method comprises
generating a surface model of the surface of the material loaded into the bucket, and
comparing the surface model with a predefined preferred surface shape associated with the bucket.

It is to be understood that the present invention is not limited to the embodiments described above and illustrated in the drawings; rather, the skilled person will recognize that many changes and modifications may be made.

The invention claimed is:

1. A system comprising:
a perception assembly adapted to:
generate a surface model of a surface of a material loaded into a loader bucket of a loader, wherein the loader bucket is adapted to be moved relative to a remaining portion of the loader to thereby be loaded with the material;
determine a bucket location of the bucket;
determine a type of material located at the bucket location;
determine a type of material loaded into the bucket based on the type of material located at the bucket location;
determine a predefined preferred surface shape associated with the loader bucket based on the type of material loaded into the bucket;
compare the surface model with the predefined preferred surface shape;
determine a material loading condition of the loader bucket based on the comparison of the surface model with the predefined preferred surface shape; and
issue a signal indicative of the material loading condition.

2. The system according to claim 1, wherein the surface model comprises a three-dimensional model of the surface of the material loaded into the loader bucket.

3. The system according to claim 1, wherein the predefined preferred surface shape comprises information indicative of a nominal angle of repose for the material loaded into the bucket.

4. The system according to claim 1, wherein the system is further adapted to determine at least one of a spillage parameter indicative of a risk of spilling or a fill factor parameter indicative of a material fill factor.

5. The system according to claim 1, wherein the signal indicative of the material loading condition is further indicative of whether or not the bucket is appropriately loaded.

6. The system according to claim 1, wherein the perception assembly comprises at least one of a camera or a laser sensor.

7. The system according to claim 6,
wherein the surface model comprises a three-dimensional model of the surface of the material loaded into the bucket, and
wherein the perception assembly further comprises at least one of a time-of-flight camera, a stereo camera, a structured light camera or an actuated laser range finder.

8. The system according to claim 6, wherein at least a portion of the perception assembly is adapted to be attached to a portion of the material moving machine.

9. The system according to claim 1, wherein the perception assembly is further adapted to identify the loader bucket by:
generating a model of the loader bucket; and
comparing the model of the loader bucket with a stored set of bucket models.

10. The system according to claim 1, wherein the system is further adapted to:
use a global positioning system (GPS) device to determine the bucket location of the loader bucket; and
access a database to determine the type of material located at the bucket location.

11. A loader comprising:
a loader bucket that is movable relative to a remaining portion of the material moving machine, wherein movement of the loader bucket causes the loader bucket to be loaded with a material, and
a system comprising a perception assembly adapted to:
generate a surface model of a surface of the material loaded into the bucket; and
compare the surface model with a predefined preferred surface shape associated with the bucket, the comparison based on a determination of a volume of the material exceeding the predefined preferred surface shape, wherein the system is further adapted to:
determine a material loading condition of the bucket based on the comparison of the surface model with the predefined preferred surface shape; and
issue a signal indicative of the material loading condition.

12. The loader according to claim 11, wherein the surface model comprises a three-dimensional model of the surface of the material loaded into the bucket.

13. The loader according to claim 11, further comprising a cabin comprising a cabin top, wherein at least the portion of the perception assembly is attached to the cabin top.

14. A method comprising:
moving a loader bucket of a loader relative to a remaining portion of the loader to load the loader bucket with a material;
generating a surface model of the surface of the material loaded into the loader bucket;
comparing the surface model with a predefined preferred surface shape associated with the loader bucket, the comparing further comprising determining a volume of the material exceeding the predefined preferred surface shape;
determining a material loading condition of the loader bucket based on the comparison of the surface model with the predefined preferred surface shape; and
issuing a signal indicative of the material loading condition.

15. The method according to claim 14, wherein the predefined preferred surface shape comprises information indicative of a nominal angle of repose for the material loaded into the loader bucket.

16. The method according to claim 15, wherein the loader bucket comprises a bucket bottom and a bucket opening rim with at least three rim points, wherein the predefined preferred surface shape is generated by forming a set of rim point planes by:
generating a rim point plane for each pair of adjacent rim points, wherein the rim point plane intersects each one of the pair of adjacent rim points and extends towards the opposing side of the loader bucket with a plane angle (a) indicative of the nominal angle of repose, and
assembling the set of rim point planes to form the predefined preferred surface shape, the predefined preferred surface shape comprising a rim point plane floor portion of each rim point plane a rim point plane floor portion having a location such that no other plane of the set of rim point planes is located between the rim point plane floor portion and the bucket bottom.

17. The method according to claim 16, wherein the bucket opening rim comprises at least three rim corners, the rim points comprising the rim corners.

18. The method according to claim 14, wherein comparing the surface model with a predefined preferred surface shape associated with the loader bucket further comprises determining the volume of the material exceeding the predefined preferred surface shape.

19. The method according to claim 16, wherein comparing the surface model with a predefined preferred surface shape associated with the loader bucket further comprises determining the volume of the material exceeding the predefined preferred surface shape, and wherein the feature of comparing the surface model with a predefined preferred surface shape associated with the loader bucket comprises determining the volume of the material that exceeds each rim point plane floor portion.

20. The method according to claim 18, wherein the feature of comparing the surface model with a predefined preferred surface shape associated with the loader bucket comprises:
determining a plurality of surface model points;
for each one of the surface model points that exceeds of the predefined preferred surface shape, determining the smallest distance between the surface model point and the predefined preferred surface shape.

21. The method according to claim 20, wherein the method further comprises determining a parameter value indicative of at least one of an average value (m) or a variance ($\sigma^2$) of the smallest distance between the surface model point and the predefined preferred surface shape for all of the surface model points that are located outside of the predefined preferred surface shape.

* * * * *